United States Patent [19]
Wong

[11] Patent Number: 5,423,944
[45] Date of Patent: Jun. 13, 1995

[54] METHOD FOR VAPOR PHASE ETCHING OF SILICON

[75] Inventor: Man Wong, Dallas, Tex.

[73] Assignee: Texas Instruments Incorporated, Dallas, Tex.

[21] Appl. No.: 184,801

[22] Filed: Mar. 11, 1994

Related U.S. Application Data

[63] Continuation of Ser. No. 904,128, Jun. 25, 1992, abandoned.

[51] Int. Cl.$^6$ .............................. H01L 21/00
[52] U.S. Cl. ................................. 156/646.1
[58] Field of Search ................ 156/662, 646

[56] References Cited

U.S. PATENT DOCUMENTS 4,605,479 8/1986 Faith, Jr. .............................. 156/646
5,078,832 1/1992 Tanaka .................................. 156/646

FOREIGN PATENT DOCUMENTS 0262627 10/1989 Japan .

OTHER PUBLICATIONS

Deal, Vapor-Phase Wafer Cleaning, Oxide Etching, and Thin Film Growth, First Intl. Symp. on Cleaning Technology in Semiconductor Mfg, Electrochem. Soc., Oct. 1989, pp. 1-8.

Wong, Moslehi, and Reed, "Characterization of Wafer Cleaning and Oxide Etching Using Vapor-Phase Hydrogen Flouride", J. Electrochem. Soc., vol. 138, No. 6, Jun. 1991, The Electrochemical Society, Inc.

Deal, McNeilly, Kao, and deLarios, "Vapor-Phase Wafer Cleaning, Oxide Etching, and Thin Film Growth", Advantage Production Technology in Semiconductor Device Mfg. at Fall Meeting, The Electrochemical Society, Hollywood, Florida, Oct. 15-20, 1989.

Wong, Liu, Moslehi, and Reed, "Preoxidation Treatment Using HCl/HF Vapor", IEEE Electron Device Letters, vol. 12, No. 8, Aug. 1991.

Primary Examiner—Thi Dang
Attorney, Agent, or Firm—Kay Houston; James C. Kesterson; Richard L. Donaldson

[57] ABSTRACT

A method for etching a silicon wafer (20) by using hydrogen fluoride and water vapor combined with ozone is disclosed. The process does not require additional energy excitation or high pressure.

17 Claims, 3 Drawing Sheets

METHOD FOR VAPOR PHASE ETCHING OF SILICON

This invention was made with government support under Contract #F33615-88-C-5448 awarded by the Air Force and DARPA. The government has certain rights in this invention.

This is a continuation of application Ser. No. 07/904,128, filed Jun. 25, 1992, now abandoned.

TECHNICAL FIELD OF THE INVENTION

This invention relates in general to the field of semiconductor manufacturing processes. More particularly, the present invention relates to a method for vapor phase etching of silicon.

BACKGROUND OF THE INVENTION

When oxidizing agents, such as nitric acid $HNO_3$ or hydrogen peroxide $H_2O_2$, are added to solutions of hydrogen fluoride HF, silicon etching could be realized via an oxidation-etch mechanism. Such processes have been used to remove contaminants and crystal defects embedded near the surface region of the wafer, resulting in longer minority carrier lifetime and improved gate oxide reliability. However, the amount of silicon etched by this technique requires careful control and monitoring to minimize surface roughness degradation.

It is therefore desirable to provide for a gas phase equivalent chemistry for a silicon slight etch. In particular, it is desirable to provide for an etching process which yields minimal surface roughness which does not require extra energy excitation such as plasma or ultraviolet photon. Additionally, the desirable process still must yield advantageous characteristics such as longer minority carrier lifetime and improved gate oxide reliability.

SUMMARY OF THE INVENTION

In accordance with the present invention, apparatus and a method for are provided which substantially eliminate or reduce disadvantages and problems associated with prior techniques.

In one aspect of the present invention, a method for etching a silicon wafer by using hydrogen fluoride vapor, water vapor combined with ozone is disclosed. The process does not require additional energy excitation or high pressure.

In another aspect of the present invention, a method for etching silicon on a wafer in a reactor is provided. Inert gases, such as nitrogen or argon, is introduced at a predetermined rate into a vaporizer containing an azeotropic solution of hydrogen fluoride and water, and the inert carrier gas is passed over the azeotropic solution to produce an hydrogen fluoride/water vapor. The hydrogen fluoride/water vapor is combined with a predetermined amount of ozone and injected into an etch chamber containing the wafer. The surface of the wafer is then etched with the vapor at a predetermined pressure and temperature for a predetermined period of time. The etch chamber is subsequently rapidly pumped down to dry the wafer surface. In other implementations, the hydrogen fluoride and water can be derived from separate sources. The mixing ratio of hydrogen fluoride to water can be varied as desired in such an implementation.

An important technical advantage of the present invention is that the process does not require additional energy excitation such as plasma or ultraviolet radiation. Additionally, the instant vapor etching process does not have special temperature or pressure requirements and proceeds at room temperature and low temperature.

BRIEF DESCRIPTION OF THE DRAWINGS

For a better understanding of the present invention, reference may be made to the accompanying drawings, in which.

DETAILED DESCRIPTION OF THE INVENTION

Figure 1:
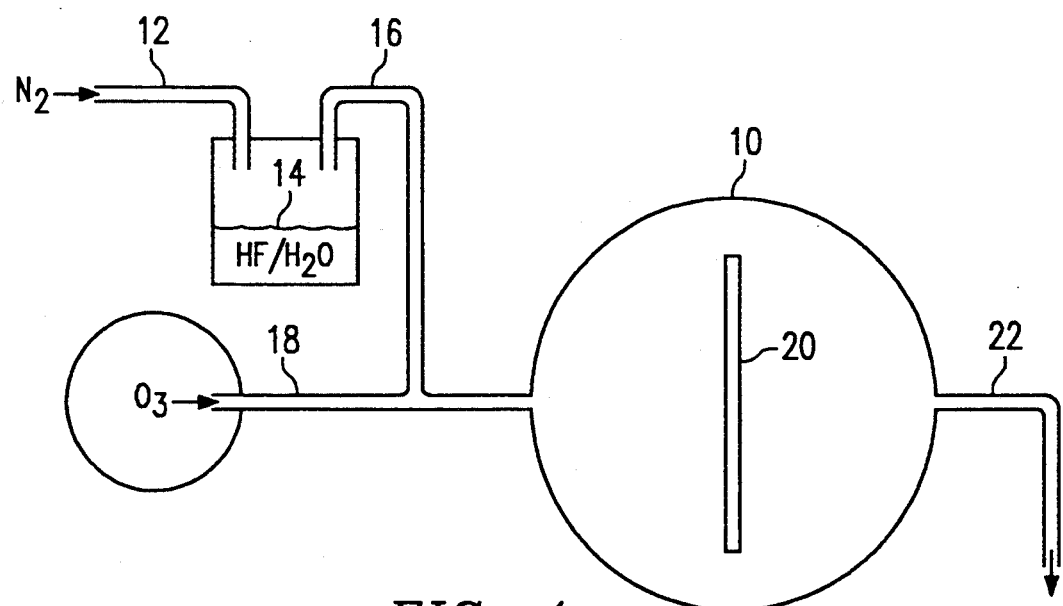
FIG. 1 is a schematic diagram of a reactor used in vapor phase etching.

As shown in FIG. 1, a schematic illustration of the present vapor phase etching process is shown. The process is shown using a SiC reactor having an etching chamber 10. SiC reactors are described in various literature such as "First International Symposium on Cleaning Technology in Semiconductor Device Manufacturing" by Deal et al. and edited by Ruzyllo et al., PV 90-9, p. 121, The Electrochemical Softbound Proceedings Series, Pennington, N.J. (1990); and "Characterization of Wafer Cleaning and Oxide Etching Using Vapor-Phase Hydrogen Fluoride" by Wong et al. in *Journal of the Electrochemical Society*, 138(6):1799, June 1990. Such reactors are commercially available from companies such as Genus, Inc. of Mountain View, Calif.

In the present vapor phase silicon etching process, gaseous nitrogen $N_2$ is passed through passageway 12 and enters into a vaporizer containing a heated azeotropic hydrogen fluoride and water solution 14, $HF/H_2O$. The $HF/H_2O$ mixture may be 38.26% hydrogen fluoride by weight, or the hydrogen fluoride to water ratio may be approximately 40:60 or any mixture of any desirable hydrogen fluoride to water ratio can be used. The nitrogen gas acts as a carrier gas and may be introduced at the rate of approximately one standard liter per minute. Other inert gases such as argon Ar may also be used as the carrier gas. The hydrogen fluoride and water vapor then exits through passageway 16 and is combined with ozone $O_3$, entering through passageway 18. The ozone may be produced in a remote plasma generator (not shown) by introducing oxygen $O_2$ at the rate of approximately one to ten standard liters per minute or may be generated internally using ultraviolet excitation. The ozone generated is approximately 5% by weight of the output from the plasma generator.

The combined hydrogen fluoride vapor and ozone then enters the etching chamber 10 containing a silicon wafer 20. The etching chamber 10 is maintained at room temperature and low process pressure, ranging between 70 torr and 550 torr. It is also contemplated that hydrogen chloride HCl may be added to the hydrogen fluoride and ozone vapor combination to provide additional cleaning during the etch. The amount of hydrogen chloride administered is discussed in "Pre-Oxidation Treatment Using HCl/HF Vapor" by Wong et al. in *IEEE Electron Device Letters*, 12(8):425, August 1991.

The data presented below are based on experiments performed on boron doped 5–10 Ω-cm (100)-oriented silicon wafers 20, with or without top layers of 200 nm undoped polysilicon (620° C.), and doped using a variety of techniques outlined in the following table. However, the present vapor phase etching process is not so limited and is applicable to silicon wafers of other configurations. The discussion below primarily operates to illustrate the characteristics and performance of the instant vapor phase silicon etch process on a collection of representative wafers.

| Doping Technique | Symbolic Notation | | | | |
|---|---|---|---|---|---|
| | PC | P | As | B | -B |
| 30 min 900° C. POCl$_3$ (polysilicon wafers only) | • | | | | |
| Phosphorus Implanted 3 × 10$^{15}$/cm$^2$: 60 kev | | • | | | |
| Arsenic Implanted 3 × 10$^{15}$/cm$^2$: 90 kev | | | • | | |
| Boron Implanted 3 × 10$^{15}$/cm$^2$: 20 keV | | | | • | |
| Starting Wafer without Polysilicon | | | | | • |
| 15 min 900° C. Anneal | | • | • | • | |

The boron doped wafer is then subjected to a deposition of 200 nm of TEOS oxide, which was densified and patterned. The oxide masked regions were distributed in a checkerboard fashion (1.5 cm$^2$ squares) over the wafer surface. The total area of the exposed silicon regions was approximately equal to that of the masked regions. After the silicon etch and the removal of the residual oxide mask, MOS capacitors were fabricated on both etched and masked regions.

The capacitor fabrication sequence began with the deposition of 400 nm of TEOS oxide for field isolation. After the active area definition, 8 nm of silicon nitride was deposited and subsequently oxidized for 30 minutes at 900° C. in a dry oxygen ambience. The resulting oxide-equivalent dielectric thickness was roughly 5.7 nm. The reason the composite gate dielectric was chosen over the thermally grown oxide was to ensure that a uniform thickness would be established over all of the samples, independent of the surface doping concentrations, and that the as-etched surface roughness would be minimally disturbed. Phosphorus implanted polysilicon was used for the gate electrodes, and sputtered aluminum was used for the backside contact. All wafers received a final 30 minutes, 450° C. anneal in Forming gas.

Figure 2:
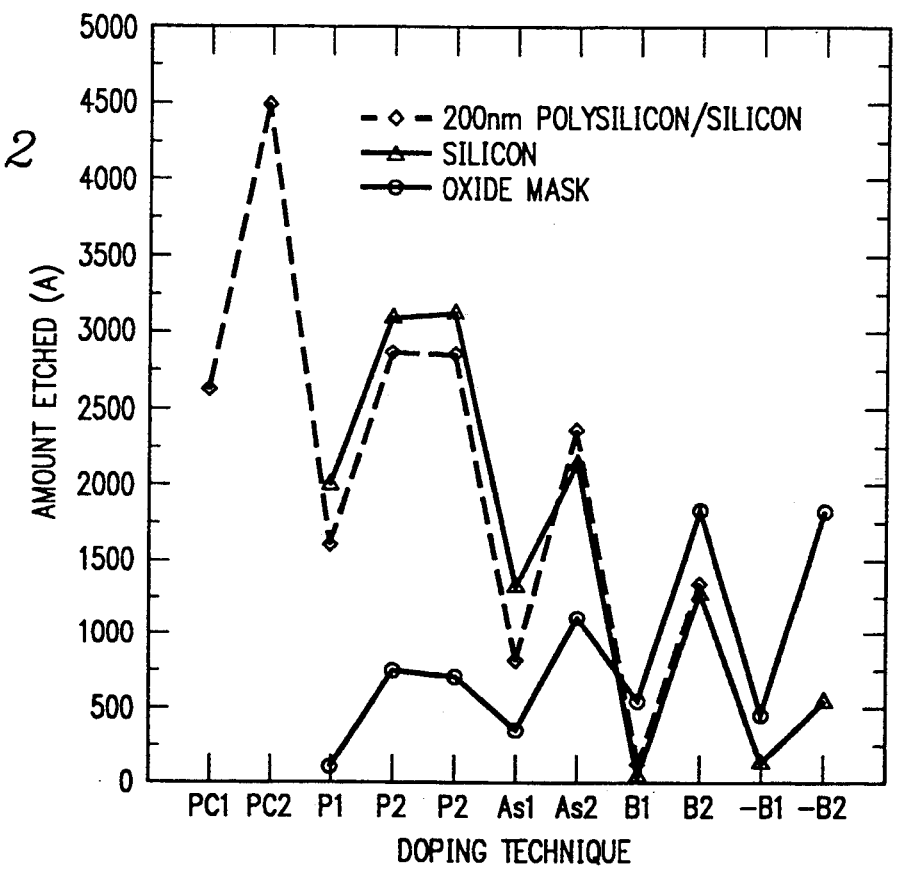
FIG. 2 is a graph comparing the amount of silicon etched from polysilicon samples of various doping techniques.

Summarized in FIG. 2 are the amount of silicon etched as measuring using a Tencor surface profilometer (not shown) and the amount of oxide mask (on the single-crystalline samples only) removed as measured using a Nanospec or an ellipsometer. The symbols on the horizontal axis are defined in Table A. The numbers 1 and 2 at the end of the symbols denote the etch durations of 60 and 120 seconds, respectively. The repeatability of the etch was demonstrated by the multiple P2 samples.

As shown in FIG. 2, the doping techniques used for the polysilicon samples are, when arranged in a descending order of the amount of silicon etched for a given etch duration, POCl$_3$ doped, phosphorus implanted, arsenic implanted, and boron implanted. The same sequence without the POCl$_3$ doping is the corresponding ordering for the single-crystalline samples. Though the amount of silicon etched was quite sensitive to how the surface was doped, it was not as sensitive to the crystallinity, i.e. polyversus single-crystalline, of the starting wafer.

The relative etch rates of the oxide mask and the silicon depend not only on the difference between the nature of the oxide mask and that of the O$_3$ grown oxide but also on the O$_3$ oxidation rate of the silicon. Thus, even if the O$_3$ grown oxide etched faster than the oxide mask, the silicon etch rate would still be lower than the oxide mask etch rate if the O$_3$ oxidation rate were sufficient low. As the oxidation rate changes with the surface doping polarity, the silicon etch rate also changes relatively to the oxide mask etch rate. This explains the observed reversal in the etch selectivity from favoring silicon etch to favoring oxide etch as the surface doping is changed from n- to p-type. Furthermore, the absolute amount of oxide etched was also observed to vary with the surface doping polarity. This implies that the etch was affected by a "loading" effect, such that the smaller amount of silicon etched for the samples with p-type surface doping consumed less HF/H$_2$O etchant, which resulted in the availability of more etchant for etching the oxide.

Figure 3:
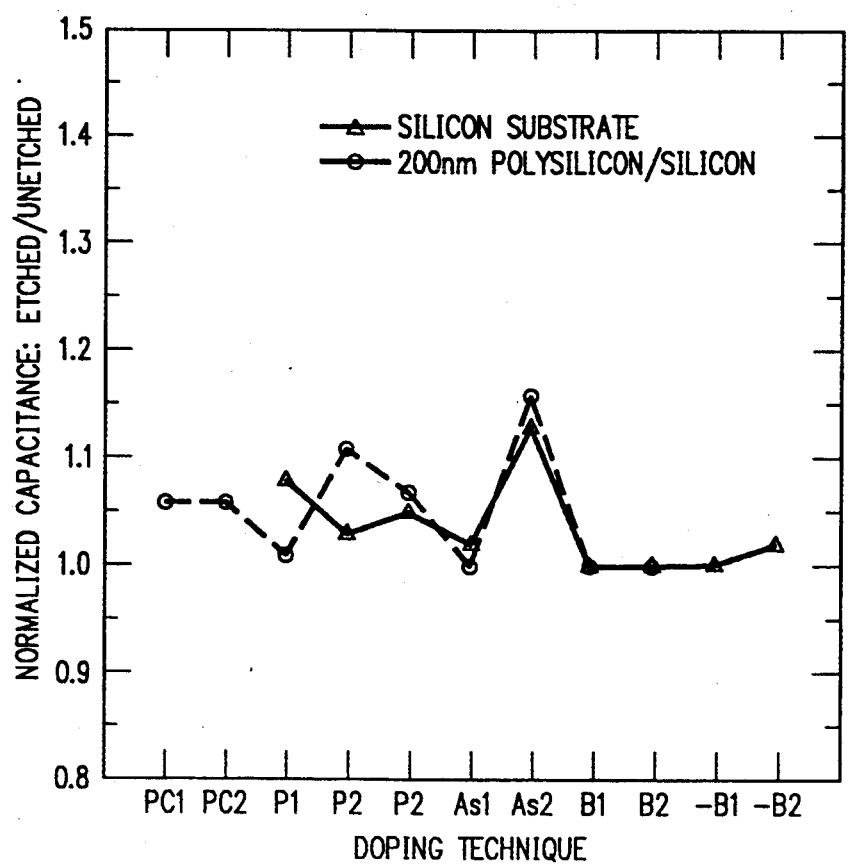
FIG. 3 is a graph comparing the normalized capacitances of polysilicon samples of various doping techniques.

With references to FIG. 3, the effects of the etch on the surface roughness were characterized by measuring the accumulation capacitances of large area (5×10$^{-4}$ cm$^2$) MOS capacitors. For each wafer, the capacitances of the capacitors on the etched area are normalized with respect to those of the capacitors on the area masked by the oxide during the silicon etch. The numbers 1 and 2 at the end of the symbols denote shorter etch durations of 20 and 40 seconds, respectively.

With the thickness of the gate dielectric fixed by the deposition, an increase in the normalized capacitance reflects a corresponding increase in the actual capacitor area due to the surface roughness. Because of the higher silicon etch rates for the samples with the n-type surface doping, more surface roughness was observed on these samples than on the samples with the p-type surface doping. Furthermore, the nature of the dopant species also affected the surface roughness after the etch. This is evident from the observation that even though a smaller amount of silicon was etched from Sample As2 (As implanted, etched for 40 seconds) than that from Sample P2 (P implanted, same etch duration), a larger increase in the capacitor area (about 15%) was measured on Sample As2.

While the accumulation capacitance can be used to characterize gross surface roughness, it is not sensitive to discretely distributed micro-asperities. Such defects are best investigated using electrical techniques because of the enhancement of the electric field at the asperities.

Figure 4:
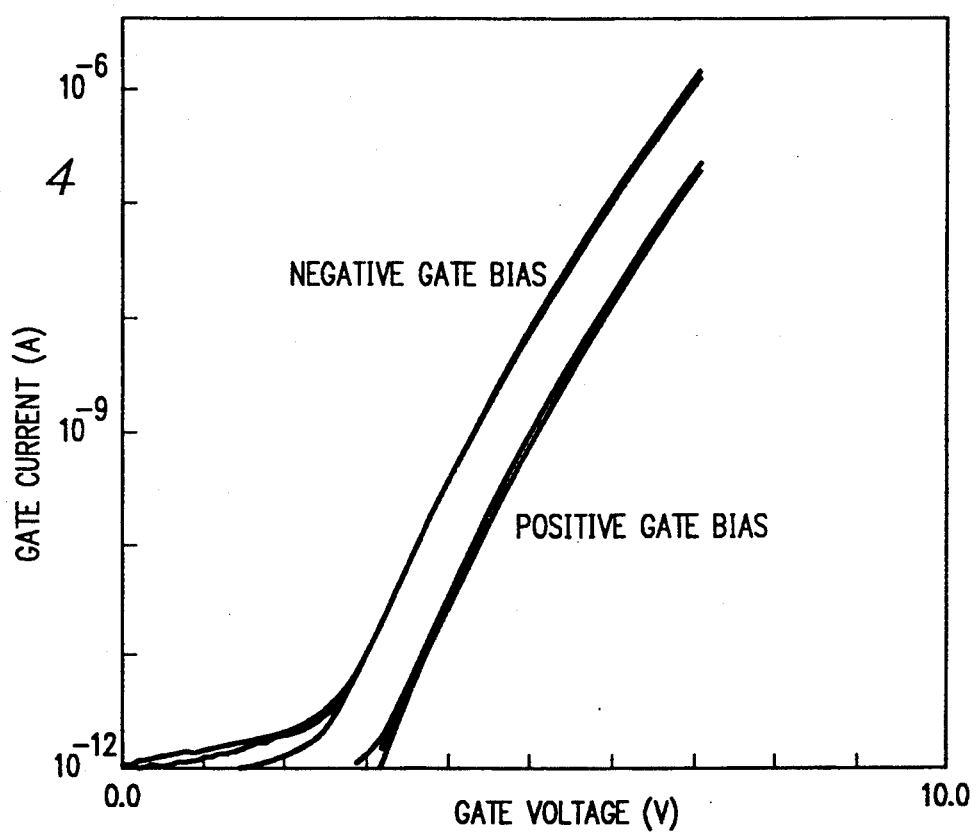
FIGS. 4 and 5 are graphs comparing current-voltage characteristics of various etched and unetched samples.
Figure 5:
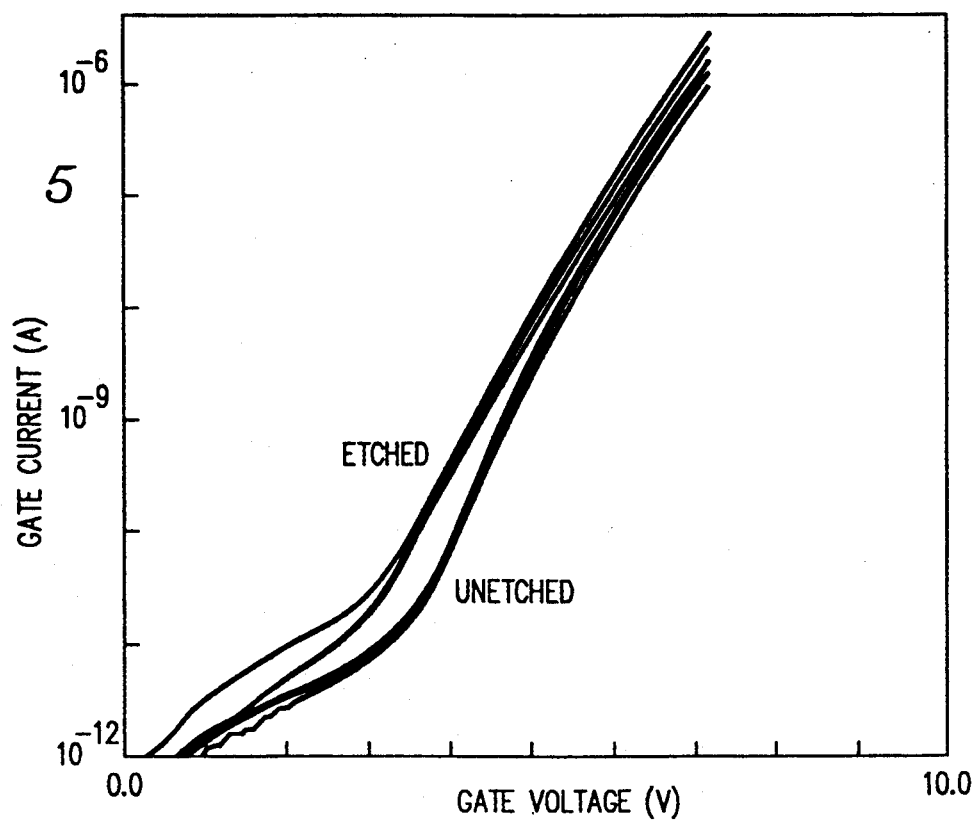

The typical current-voltage characteristics of the P1 and B1 capacitors, both having similar normalized capacitance values, are displayed in FIGS. 4 and 5, respectively. Low field current enhancement was observed for the P1 capacitors fabricated on n-type substrate. The same was not observed for the B1 capacitors fabricated on p-type substrate. The faster silicon etch rate, and consequently greater amount etched for a constant etch duration, could again explain the enhanced low field current enhancement for n-type silicon.

Although the present invention has been described in detail, it should be understood that various changes, substitutions and alterations can be made hereto without departing from the spirit and scope of the present invention as defined by the appended claims.

What is claimed is:

1. A method for etching a silicon wafer, comprising the steps of:
   masking portions of said wafer to provide masked portions and unmasked portions of a wafer surface;
   combining an hydrogen fluoride and water vapor with ozone: and
   etching silicon from said unmasked portions of said wafer surface with said combined hydrogen fluoride and ozone vapor.

2. The method, as set forth in claim 1, further comprising passing an inert gas over an azeotropic solution of hydrogen fluoride and water and producing an hydrogen fluoride and water vapor;

3. The method, as set forth in claim 1, further comprising the step of drying the wafer surface after the etching step.

4. The method, as set forth in claim 1, wherein the wafer is subjected to room temperature and low pressure during the etching step.

5. The method, as set forth in claim 3, wherein the low pressure ranges from 70 torr and 550 torr.

6. A method for etching silicon on a wafer in a semiconductor manufacturing process, comprising the steps of:
   masking portions of said wafer to provide masked portions and unmasked portions of a wafer surface;
   passing an inert gas over a heated azeotropic solution of hydrogen fluoride and water and producing an hydrogen fluoride vapor;
   combining said hydrogen fluoride vapor with ozone; and
   etching silicon from said unmasked portions of said wafer surface with said combined vapor at room temperature.

7. The method, as set forth in claim 6, wherein the inert gas is gaseous nitrogen and it is introduced at a rate of approximately one standard liter per minute.

8. The method, as set forth in claim 6, wherein the azeotropic solution of hydrogen fluoride and water is composed of approximately 40:60 hydrogen fluoride to water.

9. The method, as set forth in claim 6, further comprising the step of drying the wafer surface after the etching step.

10. The method, as set forth in claim 6, wherein said wafer is subjected to low pressure during said etching step.

11. The method, as set forth in claim 10, wherein the low pressure ranges from 70 torr and 550 torr.

12. A method for etching silicon on a wafer in a reactor, comprising the steps of:
   masking portions of said wafer to provide masked portions and unmasked portions of a wafer surface;
   introducing an inert gas into a vaporizer containing a heated azeotropic solution of hydrogen fluoride and water;
   passing said inert gas over said azeotropic solution and producing an hydrogen fluoride vapor;
   combining said hydrogen fluoride vapor with ozone;
   injecting said combined vapor into an etch chamber containing the wafer;
   etching silicon from said unmasked portions of said wafer surface with said combined vapor to remove crystal defects from said silicon; and
   rapidly pumping down the etch chamber to dry said wafer surface.

13. The method, as set forth in claim 12, wherein the inert gas is gaseous nitrogen and it is introduced at a rate of approximately one standard liter per minute.

14. The method, as set forth in claim 12, wherein the azeotropic solution of hydrogen fluoride and water is composed of approximately 40:60 hydrogen fluoride to water.

15. The method, as set forth in claim 12, wherein the wafer is subjected to room temperature and low pressure during the etching step.

16. The method, as set forth in claim 15, wherein the low pressure ranges from 70 torr and 550 torr.

17. The method, as set forth in claim 12, further comprising the step of introducing oxygen into a remote plasma generator at the rate of four standard liter per minute and producing a resultant gaseous mixture containing approximately 5% ozone.

* * * * *